United States Patent
Tihanyi

(10) Patent No.: US 7,724,064 B2
(45) Date of Patent: May 25, 2010

(54) CIRCUIT ARRANGEMENT HAVING A TRANSISTOR COMPONENT AND A FREEWHEELING ELEMENT

(75) Inventor: Jenoe Tihanyi, Kirchheim (DE); Nada Tihanyi, legal representative, Kirchheim (DE)

(73) Assignee: Infineon Technologies AG, Munich (DE)

( * ) Notice: Subject to any disclaimer, the term of this patent is extended or adjusted under 35 U.S.C. 154(b) by 458 days.

(21) Appl. No.: 11/480,337

(22) Filed: Jun. 30, 2006

(65) Prior Publication Data

US 2007/0018716 A1    Jan. 25, 2007

(30) Foreign Application Priority Data

Jul. 1, 2005    (DE) .................... 10 2005 030 886

(51) Int. Cl.
*H03K 19/00* (2006.01)
(52) U.S. Cl. .................. 327/374; 327/543; 257/140; 257/328
(58) Field of Classification Search .................. 257/140, 257/328, 360, 363, 258, 330, 355; 327/104, 327/374, 377, 427, 434, 376, 543; 438/268, 438/270, 918, 925, 968; 357/59, 86, 52, 357/23.4
See application file for complete search history.

(56) References Cited

U.S. PATENT DOCUMENTS 5,237,213 A     8/1993   Tanoi
5,760,440 A     6/1998   Kitamura et al.
6,624,683 B1 *  9/2003   Bedarida et al. ............ 327/374

FOREIGN PATENT DOCUMENTS

DE      19534 603 C1     5/1997

OTHER PUBLICATIONS

"PROFET® BTS 307," Semiconductor Group. Infineon Technologies AG: Munich. Oct. 2003. (12 Pages).

* cited by examiner

*Primary Examiner*—Rajnikant B Patel
(74) *Attorney, Agent, or Firm*—Maginot, Moore & Beck

(57) ABSTRACT

A circuit arrangement configured to drive a load is disclosed herein. The circuit arrangement comprises a first and a second supply potential terminal for application of a first supply potential and a second supply potential. A load terminal is provided between the first and second supply potential for connection of the load. The circuit arrangement further comprises a first transistor component of a first conduction type. The first transistor component includes a load path and a control terminal, with the load path connected between the first supply potential terminal and the load terminal. The circuit arrangement also comprises a freewheeling element. The freewheeling element is provided as a second transistor of a second conduction type connected up as a diode. The second transistor is connected between the load terminal and the second supply potential terminal. The first transistor component and the freewheeling element are integrated in a common semiconductor body.

20 Claims, 5 Drawing Sheets

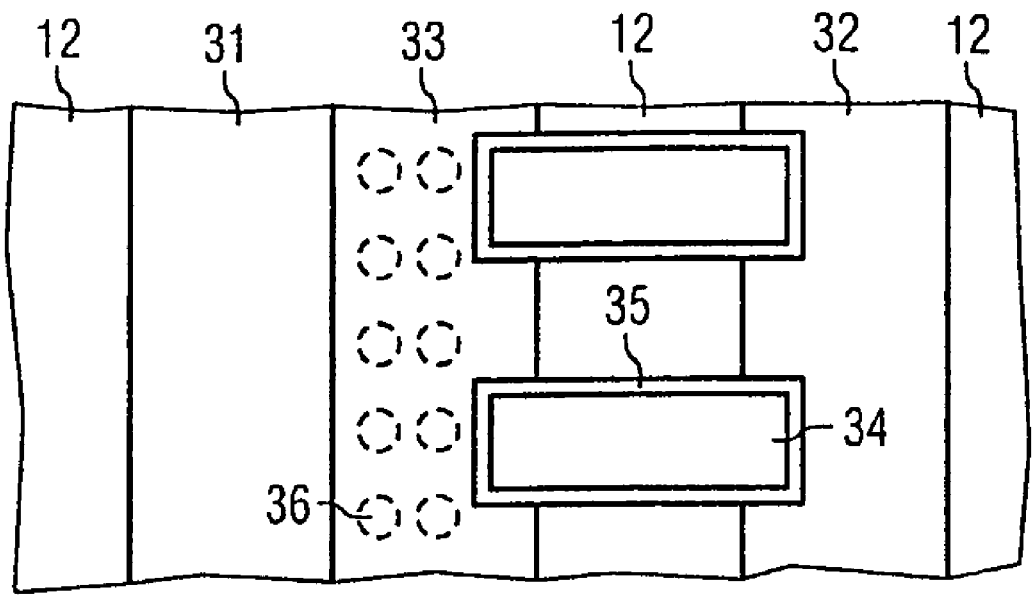
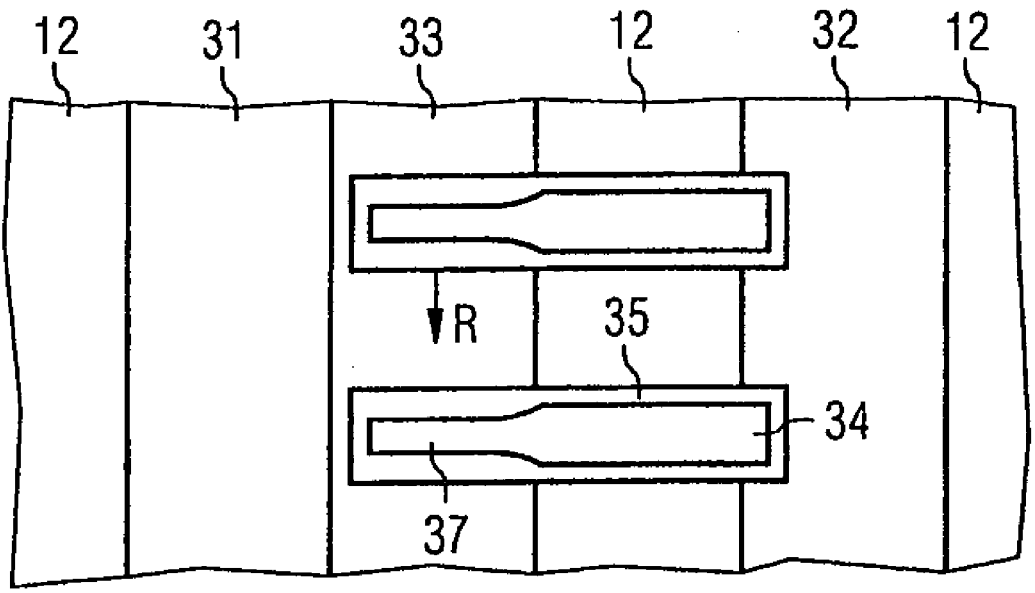

CIRCUIT ARRANGEMENT HAVING A TRANSISTOR COMPONENT AND A FREEWHEELING ELEMENT

FIELD

The present invention relates to a circuit arrangement for driving a load having a transistor component and a freewheeling element.

BACKGROUND

When driving a load using a transistor component it is generally known to connect the transistor component in series with the load between terminals for first and second supply potentials or positive and negative supply potentials. Such a circuit arrangement is illustrated in FIG. 1. In this case, the reference symbol M designates a transistor component formed as a MOSFET, the load path of which is connected between a first connecting terminal K1 for a first supply potential +V and an output terminal OUT. A load L is connected between said output terminal OUT and a second connecting terminal K2 for a second supply potential GND, so that the load path of the transistor component M and the load L are connected in series between the connecting terminals K1, K2 for the supply potentials. The load path of the MOSFET M is formed by the drain-source path thereof. The MOSFET M can be driven via its gate terminal, which forms a control terminal, by a drive circuit 10 according to a switching signal Sin. The drive circuit 10 is designed to generate a drive signal Sdrv according to the switching signal Sin, which drive signal drives the MOSFET M in the on state or in the off state according to the switching signal Sin.

An example of such a circuit arrangement having a transistor component for driving a load and a drive circuit for driving the transistor component is the integrated device BTS 307 from Infineon Technologies AG, Munich, which belongs to the PROFET® family and is described in the data sheet PROFET® BTS 307, Oct. 1, 2003, Infineon Technologies AG, Munich. In this arrangement, a transistor component formed as a power MOSFET and the associated drive circuit are monolithically integrated in a semiconductor body/semiconductor chip.

If the transistor component M in the circuit in accordance with FIG. 1 is driven in the on state, then the voltage drop across its load path D-S is usually very small in comparison with the supply voltage present between the connecting terminals K1, K2. The supply voltage is thus present approximately exclusively across the load L. When driving an inductive load, a considerable voltage loading on the semiconductor switching element M may occur after the semiconductor switching element M has been turned off, which voltage loading may be significantly greater than the supply voltage, as is explained below with reference to FIG. 2.

It shall be assumed that the semiconductor switching element M is driven in the on state depending on the switching signal Sin up to an instant toff. The output voltage Vout present across the load L then essentially corresponds to the supply voltage +V. If the semiconductor switching element M is turned off at the switch-off instant toff, then upon commutation of the inductive load L a voltage is induced which causes the potential at the output terminal OUT to fall far below the reference potential GND present at the second connecting terminal K2, so that the voltage present across the semiconductor switching element M is significantly higher than the supply voltage +V.

This fall in the potential at the output terminal OUT when the transistor component M is turned off can be counteracted by connecting a diode D in parallel with the load L. This diode D has the effect that, upon commutation of the load L, the potential at the output terminal OUT falls below the value of the reference potential GND at most by the value of the forward voltage of the diode. The diode D acts as a freewheeling element and accepts the freewheeling current flowing upon commutation of the inductive load L.

What is disadvantageous about the previously explained solution is the need to have to use an additional external component in the form of the diode D, which increases the production costs and the complexity in the realization of the circuit.

Therefore, it would be advantageous to provide a circuit arrangement for driving a load, in particular for driving an inductive load, which has a freewheeling element and which can be realized simply and cost-effectively.

SUMMARY

A circuit arrangement is disclosed herein comprising a first and a second supply potential terminal for application of a first and second supply potential and a load terminal for connection of the load. The circuit additionally comprises a transistor component of a first conduction type having a load path and a control terminal, the load path of which is connected between the first supply potential terminal and the load terminal, and a freewheeling element, which is formed as a transistor of a second conduction type connected up as a diode and is connected between the load terminal and the second supply potential terminal. In this case, the transistor component and the freewheeling element are integrated in a common semiconductor body.

On account of the integration of the freewheeling element together with the transistor component in a common semiconductor body, the freewheeling element can be realized cost-effectively and with little complexity.

The transistor component is for example a power transistor formed as a vertical MOSFET, while the freewheeling element is realized as a lateral MOSFET. The freewheeling element of the circuit arrangement can be realized for example by means of the same technology as components of an integrated drive circuit of the power transistor.

The above described features and advantages, as well as others, will become more readily apparent to those of ordinary skill in the art by reference to the following detailed description and accompanying drawings.

BRIEF DESCRIPTION OF THE DRAWINGS

Various embodiments of the present invention are explained in more detail below with reference to figures.

FIG. 6 shows a section through the semiconductor component in accordance with FIG. 5 in a sectional plane A-A, and FIG. 7 shows a sectional illustration corresponding to the sectional illustration in FIG. 6 for elucidating a further exemplary embodiment of the freewheeling element.

In the figures, unless specified otherwise, identical reference symbols designate identical components, component regions and signals with the same meaning.

DESCRIPTION

Figure 1:
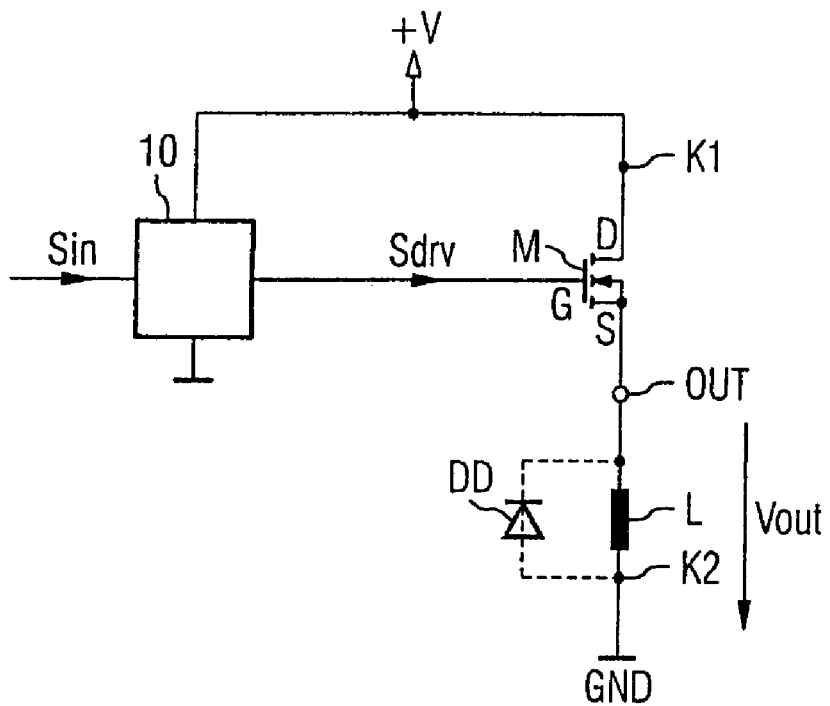
FIG. 1 shows a circuit arrangement having a semiconductor switching element for driving a load according to the prior art.
Figure 2:
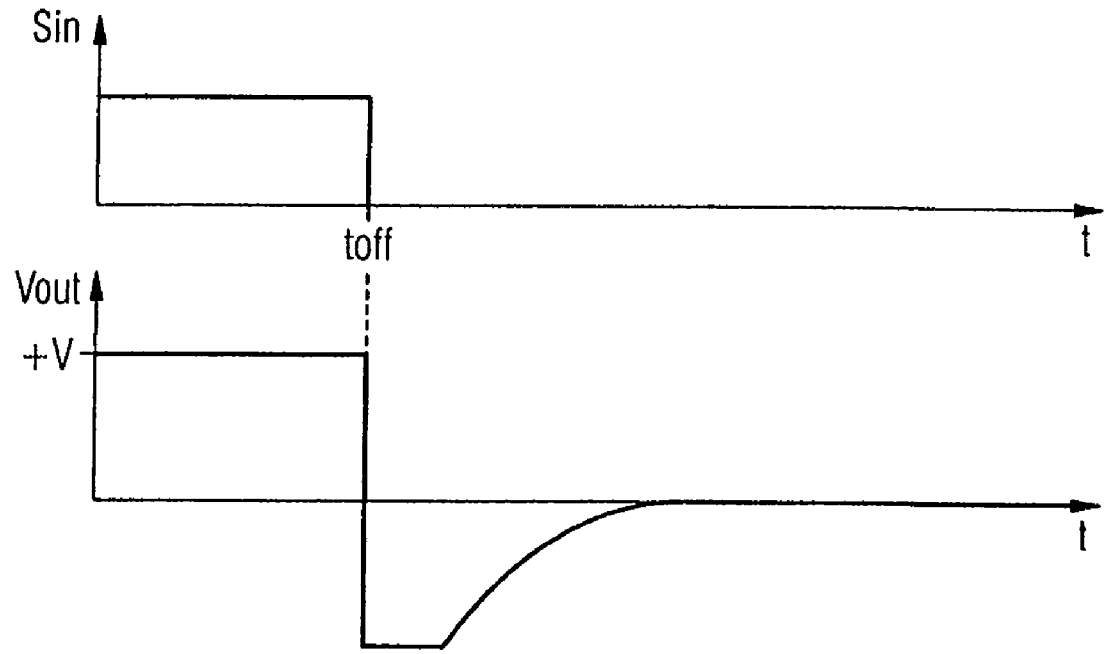
FIG. 2 shows by way of example the profile of a switching signal and the profile of a voltage present across the load for the circuit arrangement according to FIG. 1.
Figure 3:
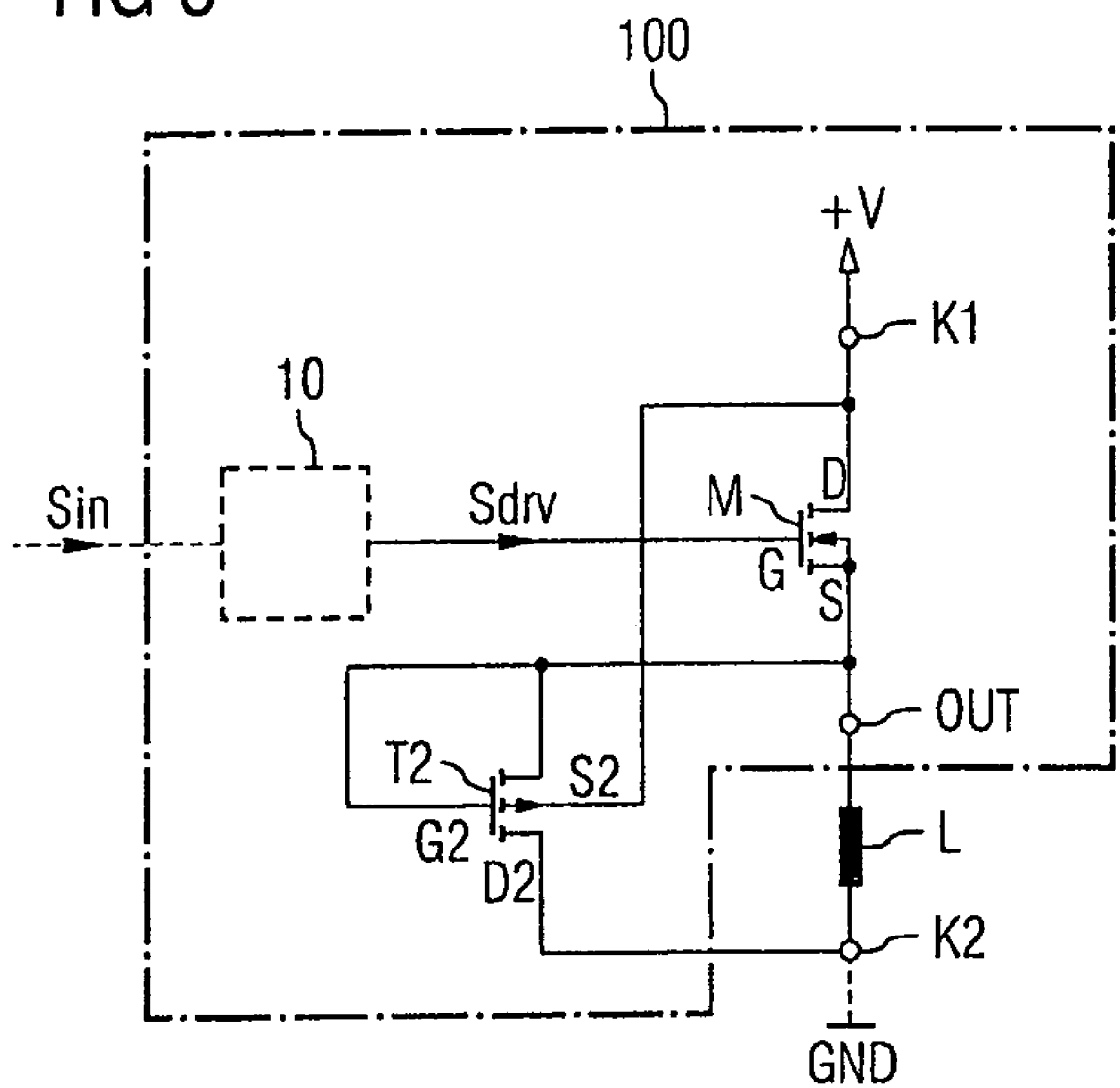
FIG. 3 shows an exemplary embodiment of a circuit arrangement having a transistor component and freewheeling element, which are integrated in a common semiconductor body.

FIG. 3 shows an exemplary embodiment of a circuit arrangement for driving a load. This circuit arrangement has first and second supply potential terminals K1, K2 for application of a first and second supply potential +V, GND and a load terminal OUT for connection of a load L. In order to afford a better understanding, in the exemplary embodiment the first supply potential terminal K1 is connected to a positive supply potential +V and the second supply potential terminal K2 is connected to a negative supply potential or reference potential GND.

The circuit arrangement additionally has a transistor component M, which is formed as an n-channel MOSFET in the example. The drain-source path of said MOSFET M forms the load path thereof and is connected between the first supply potential terminal K1 and the load connecting terminal OUT. A load L, which is formed as an inductive load in the example, can be connected between the load terminal OUT and the second supply potential terminal K2, so that, with the load L connected, the load path D-S of the MOSFET M is connected in series with the load L between the supply potential terminals K1, K2.

The MOSFET M can be driven in the on state or in the off state by means of a drive signal Sdrv. Said drive signal Sdrv is generated for example by a drive circuit 10 according to a switching signal Sin.

The circuit arrangement additionally has a freewheeling element, which is formed as a p-channel MOSFET connected up as a diode in the example and is connected between the second supply potential terminal K2 and the load terminal OUT. With the load L connected, said freewheeling element T2 is thus connected in parallel with said load L.

The p-channel MOSFET is connected up as a diode by virtue of its gate terminal G2 being short-circuited with its source terminal S2. The drain terminal D2 of the MOSFET T2 connected up as a diode is connected to the second supply potential terminal K2, while gate G2 and source S2 of the MOSFET T2 serving as a freewheeling element are jointly connected to the source terminal S of the load transistor M.

The load transistor M and the MOSFET T2 connected up as a freewheeling element are jointly integrated in a semiconductor body 100, which is illustrated schematically by a dash-dotted line in FIG. 3. The drive circuit 10 that drives the load transistor M may suitably be integrated together with the load transistor M and the freewheeling element T2 in the same semiconductor body 100.

Figure 4:
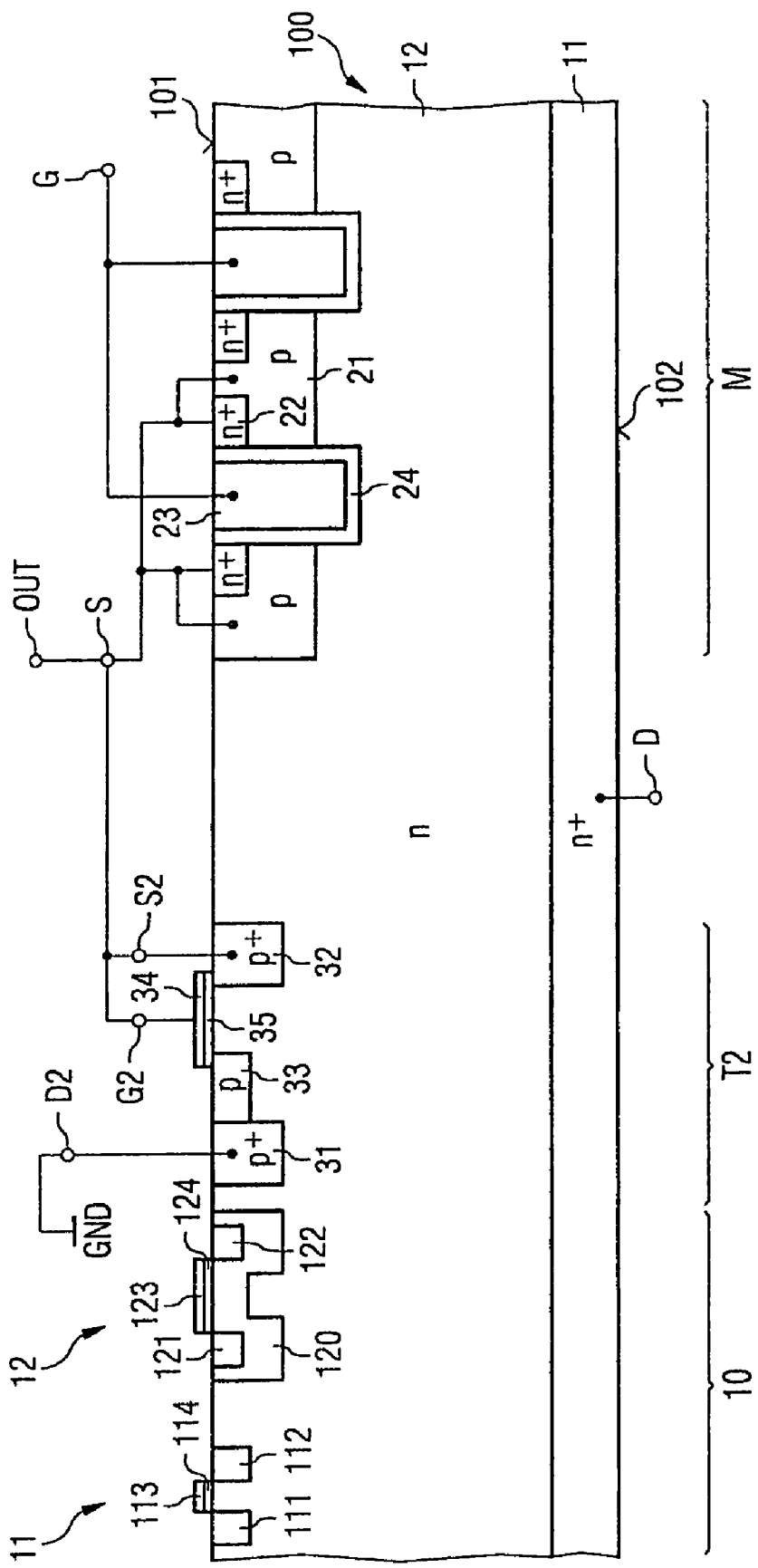
FIG. 4 shows a cross section through the semiconductor body for elucidating a freewheeling element in accordance with a first exemplary embodiment.

FIG. 4 schematically shows a cross section through the semiconductor body 100, in which the load transistor M and the freewheeling element T2 are jointly integrated. The dopings of the semiconductor body in the component regions that are yet to be explained in detail are chosen such that the load transistor M is an n-channel MOSFET and the freewheeling element is a p-channel MOSFET. It goes without saying that the load transistor could also be realized as a p-channel MOSFET and the freewheeling element as an n-channel MOSFET, in which case the dopings explained below should then be interchanged correspondingly, that is to say that n-doped regions of the figures hereafter should be correspondingly replaced by p-doped regions and p-doped regions should be replaced by n-doped regions.

The semiconductor body 100 has a heavily n-doped semiconductor zone 11 in the region of a rear side 102 of the semiconductor body 100. In the direction of a front side 101 of the semiconductor body opposite to the rear side 102, said heavily doped semiconductor zone 11 is adjoined by a more weakly n-doped semiconductor zone 12. The heavily doped semiconductor zone 11 may be realized by a semiconductor substrate, for example, to which a more weakly doped epitaxial layer is applied, which forms the more weakly doped semiconductor zone 12. Furthermore, it would also be possible to provide a more weakly doped semiconductor body, the basic doping of which corresponds to the doping of the more weakly doped semiconductor zone 12, and this semiconductor body could be more heavily doped in the region of the rear side—for example by means of ion implantation—in order to form the semiconductor zone 11.

In the example, the load transistor M is formed as a vertical power MOSFET, the drain zone of which is formed by sections of the heavily doped semiconductor zone 11 and the drift zone of which is formed by sections of the more weakly doped semiconductor zone 11. In order to realize this MOSFET, a p-doped body zone 21 is arranged in the region of the front side 101, a section of the more weakly doped semiconductor zone 11 adjoining said body zone in the vertical direction. Heavily n-doped semiconductor zones 22, which form the source zones of the load transistor M, are arranged in said body zone 21. A gate electrode 23 extends in a trench proceeding from the front side 101 in the vertical direction into the semiconductor body 100 and is insulated from the semiconductor regions by means of an insulation layer 24. The gate electrode 23 comprises, for example, a highly doped polycrystalline semiconductor material, for example polysilicon, and extends, in a manner insulated by the insulation layer 24, in the vertical direction proceeding from the source zones 22 through the body zone 21 right into the more weakly doped semiconductor zone 12, which forms the drift zone of the load transistor M. When a suitable drive potential is applied to the gate electrode 23, a conducting channel forms in the body zone 21 between the source zone 22 and the drift zone 12.

The load transistor M has a cellular structure, that is to say that there are a number of identically constructed structures present each having a source zone 22, a gate electrode 23 and a section of the body zone 21 which is arranged adjacent to the gate electrode 23 and extends from the source zone 22 to the drift zone 12. In this case, the individual gate electrodes are electrically conductively connected to one another and connected to a gate terminal (illustrated schematically), each of these gate electrodes 23 serving for controlling a conducting channel between one of the source zones 22 and the drift zone 12. The source zones 22 of the load transistor M are jointly connected to a source terminal S, which is only illustrated schematically in FIG. 4. The body zone 21 may suitably be short-circuited with the source zones 22, which is likewise illustrated schematically in FIG. 4.

In the more weakly doped semiconductor zone 12 of the semiconductor body 100, which forms the drift zone of the load transistor M in the region below the body zone 21, a p-channel MOSFET is realized in a manner spaced apart in the lateral direction with respect to the component structure of the load transistor M. Said MOSFET is formed as a lateral MOSFET and has a p-doped drain zone 31 and a p-doped source zone 32 arranged in a manner spaced apart from the drain zone 31 in the lateral direction. The drain and source zones 31, 32 are in each case arranged in the region of the front side 101 of the semiconductor body. A more weakly p-doped semiconductor zone 33 adjoins the drain zone 31 in the lateral direction in the direction of the source zone 32, which semiconductor zone forms the drift zone of the p-channel MOSFET and the doping and dimensions of which semiconductor zone critically determine the dielectric strength of this p-channel MOSFET. A section of the more weakly n-doped semiconductor zone 12 that is arranged between said drift zone 33 and the source zone 32 forms the body zone of said p-channel MOSFET. In the example, a gate electrode 34 of said p-MOSFET is arranged above the front side 101 and is insulated from the semiconductor body by an insulation layer 35.

The short circuit between the gate electrode 34 and the source zone 32 that is required in order to realize the diode function is only illustrated schematically in FIG. 4. Gate G2 and source S2 of said p-channel MOSFET are jointly connected to the source terminal S of the load transistor M in the manner elucidated. Said transistor is driven in the on state when the potential at the drain terminal D2 rises above the potential at the common source-gate terminal S2, G2 of said MOSFET by the value of the threshold voltage of said MOSFET. The MOSFET thereby functions as a diode.

The p-channel MOSFET serving as a freewheeling element can be realized in the same semiconductor body 100 as the load transistor M in a simple manner. The realization of said freewheeling element may, in particular, be effected together with the realization of low-voltage components or logic components which form the drive circuit 10 of the load transistor M. FIG. 4 illustrates a p-conducting transistor 11 and an n-conducting transistor 12 as representative of the components of said drive circuit 10. The p-conducting transistor has p-doped source and drain zones 111, 112 spaced apart from one another. The body zone of said p-type transistor is formed by a section of the more weakly doped semiconductor zone 12 that lies between source and drain 111, 112. A gate electrode 113 of said transistor is arranged above the front side 101 in a manner insulated by an insulation layer 114. In order to realize the n-conducting transistor 12, a p-doped well 120 is arranged in the region of the front side 101 of the semiconductor body, n-doped source and drain zones 121, 122 being realized in said well in a manner spaced apart from one another in the lateral direction. A gate electrode 123, which is arranged in a manner insulated from drain and source zones 121, 122 by an insulation layer 124, serves for forming a conducting channel between source and drain zones 121, 122 in the p-doped body zone lying between source 121 and drain 122.

The lateral p-channel MOSFET serving as a freewheeling element may also be realized in a corresponding manner during the method steps during which the transistors 11, 12 are realized. The increased dielectric strength of said lateral MOSFET in comparison with the dielectric strength of the logic components 11, 12 results from the more weakly doped drift zone 33 which adjoins the drain zone 31 in the lateral direction and which is also referred to as a so-called drain extension in the case of such a component. The channel width of this MOSFET is in this case significantly greater than the channel width of the logic transistors which realize the drive circuit 10.

Figure 5:
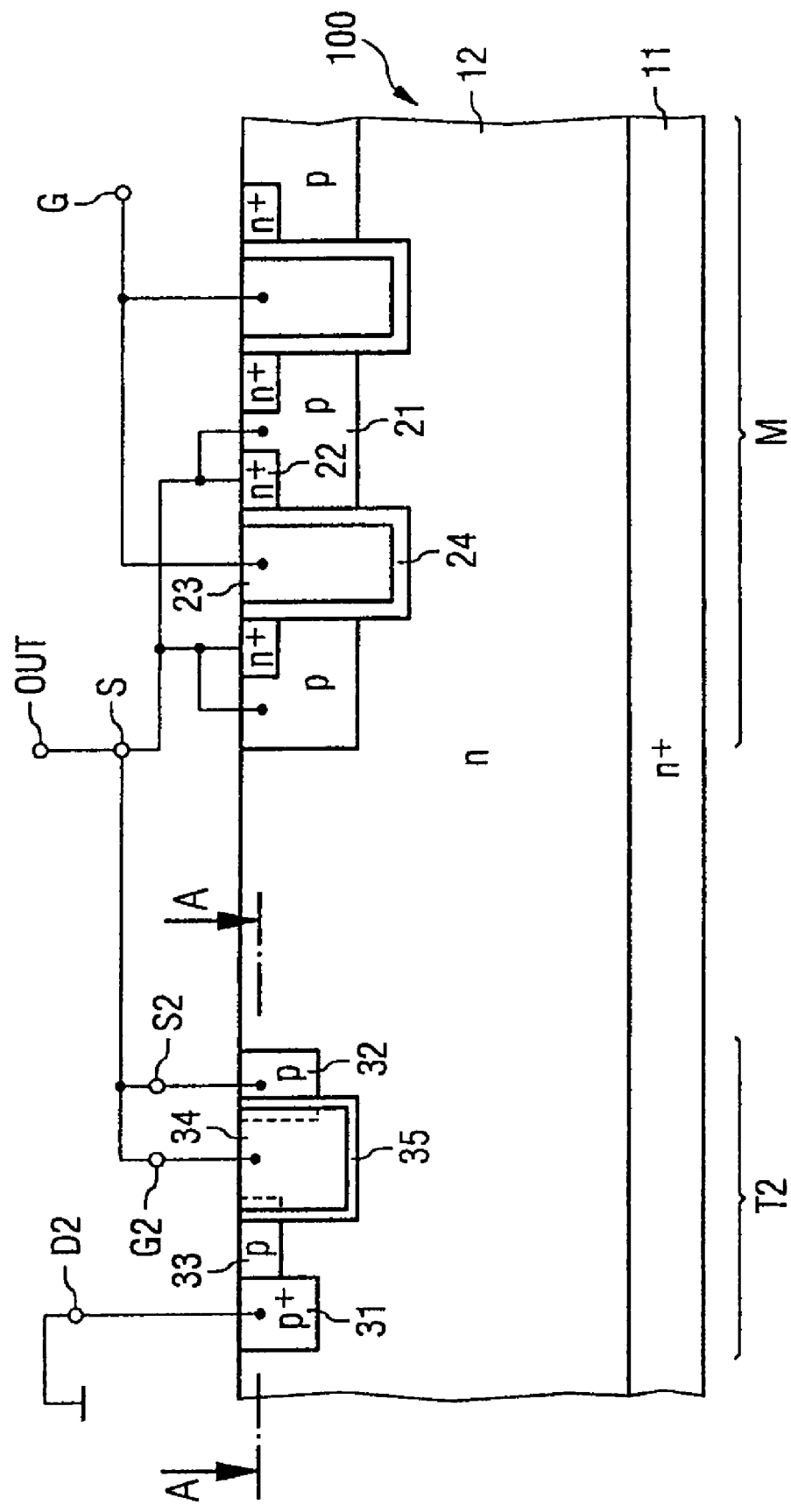
FIG. 5 shows a cross section through the semiconductor body for elucidating a freewheeling element in accordance with a second exemplary embodiment.

A further example for the realization of the p-channel MOSFET serving as a freewheeling element is explained below with reference to FIGS. 5 and 6.

In this example, the gate electrode 34 of the MOSFET is formed in a trench extending into the semiconductor body 100 in the vertical direction between drift zone 33 and source zone 32 proceeding from the front side 101. In this case, the gate electrode 34 has a plurality of electrode sections which are arranged in a manner spaced apart from one another and are in each case insulated from the semiconductor zones by an insulation layer 35, as can be seen in particular from the cross section through the sectional plane A-A in FIG. 6. A section of the more weakly doped semiconductor zone 12 is in each case present between the individual gate electrode sections and forms the body zone of the p-channel MOSFET in the region of the latter. When a suitable drive potential is applied to the gate electrode sections 34, a conducting channel forms in the n-doped body zone 12 between the drift zone 33 and the source zone 32 along the electrode sections 34.

In order to further increase the dielectric strength of the p-channel MOSFET, there is the possibility, referring to FIG. 6, of forming the p-channel transistor as a compensation component. For this purpose, n-doped semiconductor zones 34 which are formed in pillar-type fashion and extend into the semiconductor body in the vertical direction proceeding from the front side 101 are produced in the p-doped drift zone 33. These semiconductor zones 34 doped complementarily to the drift zone 33 are illustrated in plan view in FIG. 6. These pillar-type semiconductor zones have a circular cross section, for example, that may also have a square or arbitrary polygonal cross section.

FIG. 7 shows, in a sectional plane corresponding to the sectional plane in accordance with FIG. 6, a further exemplary embodiment of the p-channel MOSFET serving as a freewheeling element. This MOSFET differs from the one illustrated in FIG. 6 by virtue of the fact that the trenches with the gate electrodes 34 arranged therein extend far into the drift zone 33 in the lateral direction. In this case, the trenches may reach as far as the boundary with the drain zone 31 or even right into the drain zone 31. The gate electrodes fulfill the function of field plates 37 in the region of the drift zone and are surrounded by a thicker insulation layer 35 there than in the region of the body zone 12. This is achieved in the example by virtue of the fact that the gate electrodes taper in the region of a drift zone 33, while the trenches have an at least approximately identical width over their entire length. The distance between the individual trenches with the gate electrodes 34 or field plates 37 arranged therein and the doping of the p-type drift zone are co-ordinated with one another such that the p-type dopant dose between two trenches in a direction R perpendicular to the longitudinal extent of the trenches is less than $2 \cdot 10^{12}$ cm$^{-2}$.

With the component being driven in the on state, when the electrical potential of the field electrodes is lower than the potential in the drift zone 33, the field electrodes 37 bring about an accumulation of p-type charge carriers in the drift zone 33 and thus reduce the on resistance of the component in comparison with the component without such field electrodes. Only the doping of the drift zone and the extent thereof in the lateral direction are critical, by contrast, for the blocking capability of the component.

While the invention disclosed herein has been described in terms of several preferred embodiments, there are numerous alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A circuit arrangement for driving a load, the circuit arrangement comprising:
   a first supply potential terminal, a second supply potential terminal, and a load terminal, the first supply potential terminal configured for application of a first supply potential, the second supply potential terminal configured for application of a second supply potential, and the load terminal configured for connection of the load;
   a first transistor component of a first conduction type, the first transistor component having a load path and a control terminal, the load path connected between the first supply potential terminal and the load terminal; and
   a freewheeling element provided as a second transistor component of a second conduction type, the second transistor component connected between the load terminal and the second supply potential terminal, the first transistor component and the second transistor component being integrated in a common semiconductor body.

2. The circuit arrangement of claim 1 wherein the first transistor component is a vertical MOSFET and the second transistor component is a lateral MOSFET.

3. The circuit arrangement of claim 2 wherein the first transistor component and the second transistor component each include a drain zone, a drift zone, a body zone and a source zone, wherein the drift zone of the first transistor component and the body zone of the second transistor component are formed by a common semiconductor zone.

4. The circuit arrangement of claim 3 wherein the drain zone of the first transistor component is arranged in a rear side region of the semiconductor body, and wherein the source zone of the first transistor component is arranged in a front side region of the semiconductor body.

5. The circuit arrangement of claim 3 wherein the drain zone, the drift zone, the body zone, and the source zone of the second semiconductor component are arranged in a front side region of the semiconductor body.

6. The circuit arrangement of claim 1 wherein the first transistor component is an n-channel MOSFET and the second transistor component is a p-channel MOSFET.

7. The circuit arrangement of claim 6 wherein the first transistor component and the second transistor component each include a drain zone, a drift zone, a body zone and a source zone, wherein the drift zone of the first transistor component and the body zone of the second transistor component are formed by a common semiconductor zone.

8. The circuit arrangement of claim 7 wherein the drain zone of the first transistor component is arranged in a rear side region of the semiconductor body, and wherein the source zone of the first transistor component is arranged in a front side region of the semiconductor body.

9. The circuit arrangement of claim 7 wherein the drain zone, the drift zone, the body zone, and the source zone of the second semiconductor component are arranged in a front side region of the semiconductor body.

10. The circuit arrangement of claim 1 further comprising a drive circuit, the drive circuit connected to the control terminal of the first transistor component and integrated in the common semiconductor body with the first transistor component and the second transistor component.

11. The circuit arrangement of claim 1 wherein the second transistor is operable to act as a diode between the load terminal and the second supply potential terminal.

12. The circuit arrangement of claim 11 wherein the second transistor includes a first terminal, a second terminal, and a control terminal, wherein the control terminal of the second transistor is short circuited with the first terminal of the second transistor.

13. A circuit arrangement comprising:
    a first supply potential;
    a second supply potential;
    a load provided between the first supply potential and the second supply potential;
    a first transistor of a first conduction type, the first transistor including a load path and a control terminal, the load path connected between the first supply potential and the load;
    a second transistor of a second conduction type, the second transistor including a first terminal, a second terminal and a control terminal, the first terminal connected between the load path of the first transistor and the load, the second terminal connected to the second supply potential, and the control terminal of the second transistor connected to the first terminal, wherein the first transistor and the second transistor are integrated in a common semiconductor body.

14. The circuit arrangement of claim 13 wherein the first transistor is a vertical MOSFET and the second transistor is a lateral MOSFET.

15. The circuit arrangement of claim 13 wherein the first transistor is an n-channel MOSFET and the second transistor is a p-channel MOSFET.

16. The circuit arrangement of claim 13 further comprising a drive circuit, the drive circuit connected to the control terminal of the first transistor and integrated in the common semiconductor body with the first transistor and the second transistor.

17. A circuit arrangement comprising:
    a first supply potential terminal, a second supply potential terminal, and a load terminal, the first supply potential terminal configured for connection to a first supply potential, the second supply potential terminal configured for connection to a second supply potential, and the load terminal configured for connection to a load;
    a first transistor component including a load path and a control terminal, the load path connected between the first supply potential terminal and the load terminal; and
    a second transistor including a source terminal, a drain terminal and a gate terminal, the source terminal connected to the load terminal, the drain terminal connected to the second supply potential terminal, and the gate terminal connected to the source terminal.

18. The circuit arrangement of claim 17 wherein the first transistor and the second transistor are integrated in a common semiconductor body.

19. The circuit arrangement of claim 18 further comprising a drive circuit, the drive circuit connected to the control terminal of the first transistor and integrated in the common semiconductor body with the first transistor and the second transistor.

20. The circuit arrangement of claim 17 wherein the first transistor is of a first conduction type and the second transistor is of a second conduction type.

* * * * *